(12) United States Patent
Sharifi et al.

(10) Patent No.: US 7,473,579 B2
(45) Date of Patent: Jan. 6, 2009

(54) SELF-ALIGNED WAFER LEVEL INTEGRATION SYSTEM

(75) Inventors: Hasan Sharifi, West Lafayette, IN (US); Saeed Mohammadi, Zionsville, IN (US); Linda P. B. Katehi, Zionsville, IN (US)

(73) Assignee: Purdue Research Foundation, West Lafayette, IN (US)

( * ) Notice: Subject to any disclaimer, the term of this patent is extended or adjusted under 35 U.S.C. 154(b) by 272 days.

(21) Appl. No.: 11/343,256

(22) Filed: Jan. 27, 2006

(65) Prior Publication Data

US 2007/0278631 A1    Dec. 6, 2007

Related U.S. Application Data

(60) Provisional application No. 60/648,873, filed on Jan. 31, 2005.

(51) Int. Cl.
*H01L 21/44* (2006.01)
*H01L 21/48* (2006.01)

(52) U.S. Cl. .................. 438/107; 438/106; 438/127; 438/712; 438/781; 257/723; 257/E21.598

(58) Field of Classification Search ............. 438/107, 438/127, 712, 718, 106; 257/723, E21.505
See application file for complete search history.

(56) References Cited

U.S. PATENT DOCUMENTS

| | | | |
|---|---|---|---|
| 4,226,657 A * | 10/1980 | Cottingham | ............... 156/196 |
| 5,297,006 A | 3/1994 | Mizukoshi | |
| 5,331,235 A | 7/1994 | Chun | |
| 5,572,068 A | 11/1996 | Chun | |
| 6,117,704 A * | 9/2000 | Yamaguchi et al. | .......... 438/100 |
| 6,316,727 B1 | 11/2001 | Liu | |
| 6,506,633 B1 * | 1/2003 | Cheng et al. | ................ 438/126 |
| 6,528,351 B1 * | 3/2003 | Nathan et al. | ............... 438/118 |
| 6,611,434 B1 | 8/2003 | Lo et al. | |
| 6,713,857 B1 | 3/2004 | Tsai | |
| 2001/0052535 A1 | 12/2001 | Zhu et al. | |
| 2003/0025833 A1 | 2/2003 | Bata et al. | |

* cited by examiner

*Primary Examiner*—Nitin Parekh
(74) *Attorney, Agent, or Firm*—Brinks Hofer Gilson & Lione (57) ABSTRACT

A polymer-based, self-aligned wafer-level heterogeneous integration system, SA WLIT, for integrating semiconductor integrated circuit (IC) chips to a substrate is presented. The system includes a method including preparing a substrate, flipping the substrate onto a polymer-based flat surface and securing the substrate to the flat surface, mounting semiconductor chips into the prepared substrate, integrating the chips to the substrate with another polymer-based material, and removing the resulting multi-chip module from the flat surface. The chips may then be connected with each other and regions off the multi-chip module with metal interconnect processing technology.

A multi-chip module prepared by the polymer-based, self-aligned heterogeneous integration system including semiconductor chips mounted in a prepared substrate. The chips may be connected to the substrate by a polymer-based integrating material.

15 Claims, 7 Drawing Sheets

SELF-ALIGNED WAFER LEVEL INTEGRATION SYSTEM

CROSS-REFERENCE TO RELATED APPLICATIONS

This application is based on and claims all available benefit to our U.S. Provisional Application 60/648,873 filed Jan. 31, 2005.

FIELD OF THE INVENTION

This application relates to semiconductor chip-to-package integration technologies, and particularly to a polymer-based heterogeneous integration technology that allows high density interconnects between chips and the package.

BACKGROUND OF THE INVENTION

Advanced Electronic Packaging is a multidisciplinary technology defined as the combination of engineering and manufacturing technologies required to convert an electronic circuit into a manufactured assembly. One of the most critical levels of electronic packaging is that of packaging and interconnecting integrated circuit (IC's) and semiconductor devices. There are four major chip-to-package interconnection techniques available today: Wire Bond, Beam Lead, Tape Automated Bonding (TAB), and Flip Chip.

Using available technologies, there is typically a minimum pitch size of approximately 100 µm×100 µm for reliable connection between a metallization pad on the chip and the pad on the package. This pitch size places limitations on the density of interconnections coming out of the chip and introduces additional parasitic capacitance, due to the required large contact area. Driver circuits are often needed to support I/O pads for speedy operation. Therefore, there exists a need for a high-density-interconnect multi-chip module integration technology.

BRIEF SUMMARY OF THE INVENTION

The application is based on System in a Package (SIP) technology. The approach of SIP is to remove bulky passive elements from expensive active chips, which often use very low feature sizes (tens to hundreds of nm), and to fabricate the passive elements on a less expensive carrier substrate, thereby reducing the cost of the integrated system. At the same time, integrated chips may be fabricated using different technologies into one integrated substrate (heterogeneous integration).

With the technology of this application, the minimum width of the interconnects may be less than 20 µm×20 µm, which results in fewer parasitic elements and possibly avoids the need for I/O drivers altogether.

The application presents a method for packaging integrated circuit (IC) chips using a heterogeneous, polymer-based integration technology including the following steps. First, using deep reactive ion etching, laser ablation or punching, patterned and recessed positions are created in a substrate. The substrate is therefore prepared for integration with IC chips. The substrate can be a Si or quartz wafer, a flexible polymer wafer (such as Liquid Crystal Polymer), or a ceramic substrate (such as a low temperature co-fired ceramic (LTCC) substrate). Next, the prepared substrate is flipped onto a flat and sticky surface (which is composed of a polymer-based material), and the substrate is secured to the flat surface using a bonding agent such as a soap film. After the substrate is secured to the flat surface, the IC chips are inserted into the patterned and recessed positions of the substrate, in the proper positions designated for the IC chips, thereby creating trenches between the lateral walls of the IC chips and the walls of the recessed positions in the substrate. The IC chips are placed in a self-aligned fashion as their exact location is pre-determined by the recessed positions in the substrate.

Next, the trenches between the IC chips and the walls of the recessed positions in the substrate are filled with another polymer-based material, such as a polydimethylsiloxane (PDMS), ultraviolet (UV) cure epoxy resin or adhesive, an electronic grade encapsulant, a die attach adhesive, an epoxy, deposited amorphous Si, or deposited or electroplated Au, Cu, or Al or combination thereof. This integrates the IC chips with the prepared substrate. The deposited polymer-based material may be allowed to polymerize for a period of time. When the polymer has polymerized, the integrated IC chip and substrate network is now a multi-chip module (MCM).

The MCM is then removed from the flat surface. A thin layer of a high-dielectric material, such as a negative, epoxy-type, near-UV photoresist, polyimide, low-k benzocyclobutene (BCB), low-temperature deposited silicon dioxide (SiO2), silicon nitride (Si3N4), or aluminum oxide (Al2O3), or LCP may be deposited on the surface of the multi-chip module to improve the surface flatness. The MCM may then be prepared for an interconnect process in which metal lines are patterned and deposited on the surface of the multi-chip module, creating connections between the IC chips in the multi-chip module and to regions off of the multi-chip module.

The application also presents an MCM including a substrate, IC chips, and a polymer-based integrating material. The IC chips are integrated into the substrate to form a multi-chip module by the integrating material, such as a polydimethylsiloxane (PDMS), ultraviolet (UV) cure epoxy resin or adhesive, an electronic grade encapsulant, a die attach adhesive, an epoxy, deposited amorphous Si, or deposited or electroplated Au, Cu, or Al or combination thereof deposited into the trenches between the substrate walls and the lateral walls of the IC chips placed into the substrate. The IC's MCM may then be connected with a standard metal interconnect pattern and deposition process.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF SEVERAL VIEWS OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE INVENTION

Figure 1:
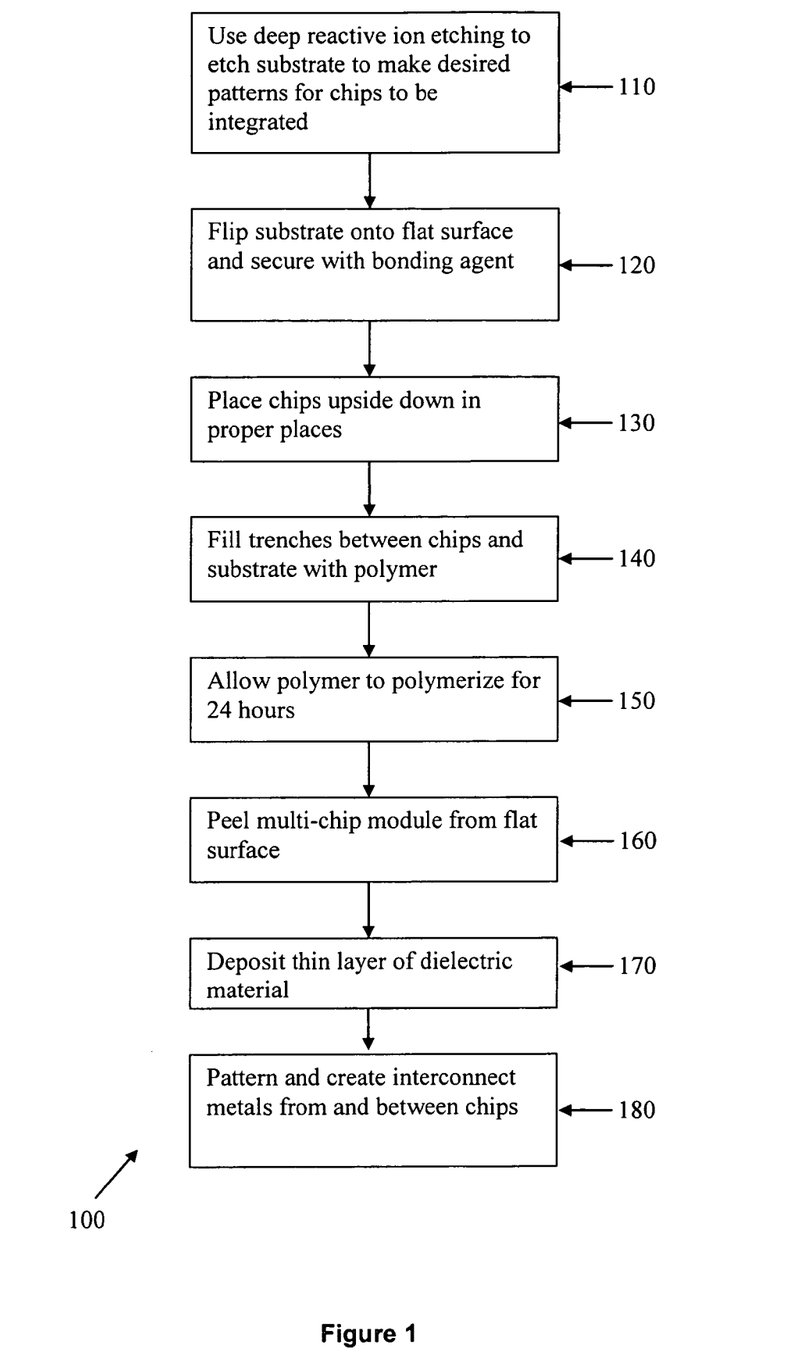
FIG. 1 is an example flow diagram of a self-aligned wafer-level integration technology (SA WLIT).
Figure 2:
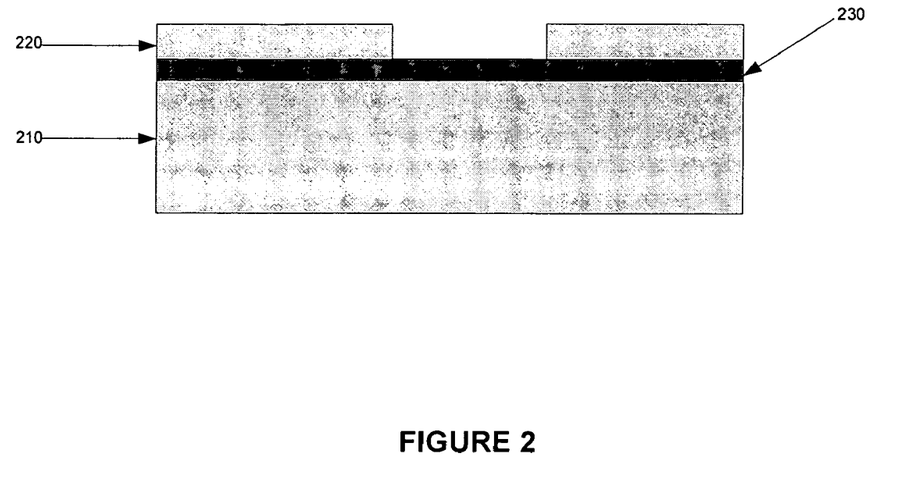
FIG. 2 is an example diagram of a prepared substrate flipped onto a flat surface and secured to a flat surface.

The application presents a method for a polymer-based multi-chip integration process 100 as presented in FIG. 1. By using deep reactive ion etching (DRIE), laser ablation or punching, at block 110, the substrate 220 (see FIG. 2) may be removed to make desired recessed, patterned positions for semiconductor integrated circuit (IC) chips 340 (see FIG. 3) that are to be integrated with the substrate 220. The substrate 220 may be, but is not limited to, silicon (Si), gallium arsenide (GaAs), liquid crystal polymer (LCP), quartz or LTCC. The size of patterns created may be a little larger than the width of the IC chips. The typical difference in size between the width of the pattern and the IC chip is 10 μm.

Figure 3:
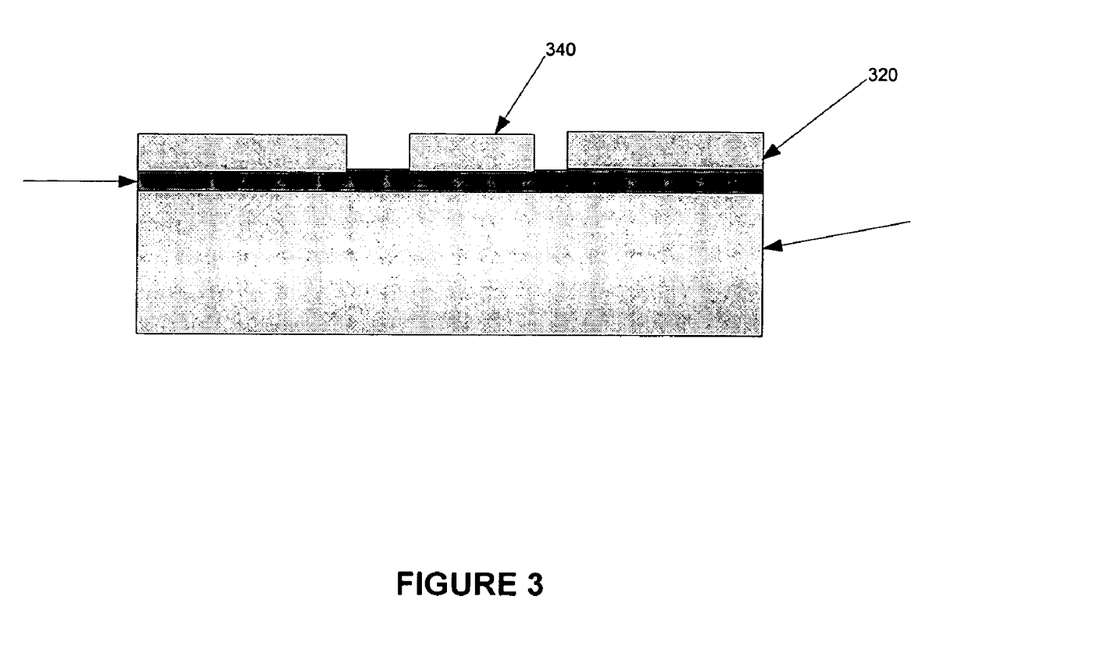
FIG. 3 is an example diagram of a substrate and mounted semiconductor chips on a flat surface.
Figure 4:
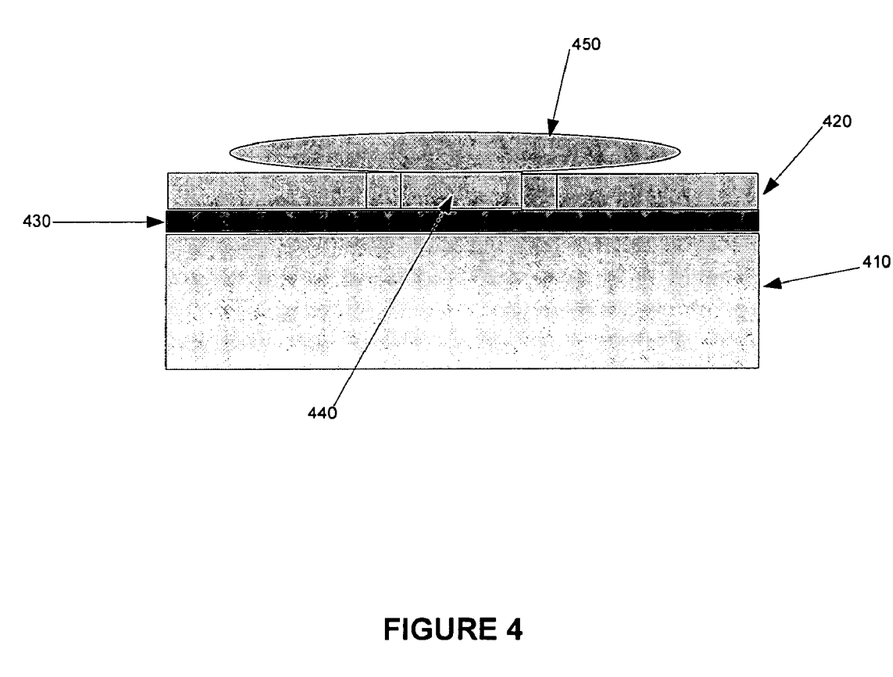
FIG. 4 is a second example diagram of a substrate and semiconductor chips on a flat surface.

Next, as shown in FIG. 3, the substrate 320 is flipped, at block 120, (placed upside down) onto a flat surface 310, which may be composed of a polydimethylsiloxane (PDMS), ultraviolet (UV) cure epoxy resin or adhesive, an electronic grade encapsulant, a die attach adhesive, an epoxy, deposited amorphous Si, or deposited or electroplated Au, Cu, or Al or combination thereof. The substrate 320 is secured to the flat surface 310 by a bonding agent 330, such as a layer of soap film, between the substrate 320 and the flat surface 310. The soap film may be a solution of 90% DI water and 10% standard dish soap, although other dissoluble bonding agents may be used. After the substrate 320 has been flipped 120 and secured to the flat surface 310, the IC chips 340 to be integrated may be picked and placed upside down inside their proper places, at block 130, in the patterned regions of the substrate 320, creating trench-like regions between the lateral sides of the semiconductor chips 340 and the lateral walls of the patterned recesses of the substrate 320. The trenches between the substrate 420 and chips 440 can be filled, at block 140, by a polymer-based material 450, such as a polydimethylsiloxane (PDMS), ultraviolet (UV) cure epoxy resin or adhesive, an electronic grade encapsulant, a die attach adhesive, an epoxy, deposited amorphous Si, or deposited or electroplated Au, Cu, or Al or combination thereof, as depicted in FIG. 4. PDMS is a polymer widely used in advanced packaging. PDMS has very low conductivity, and low loss tangent for high frequency applications.

Figure 5:
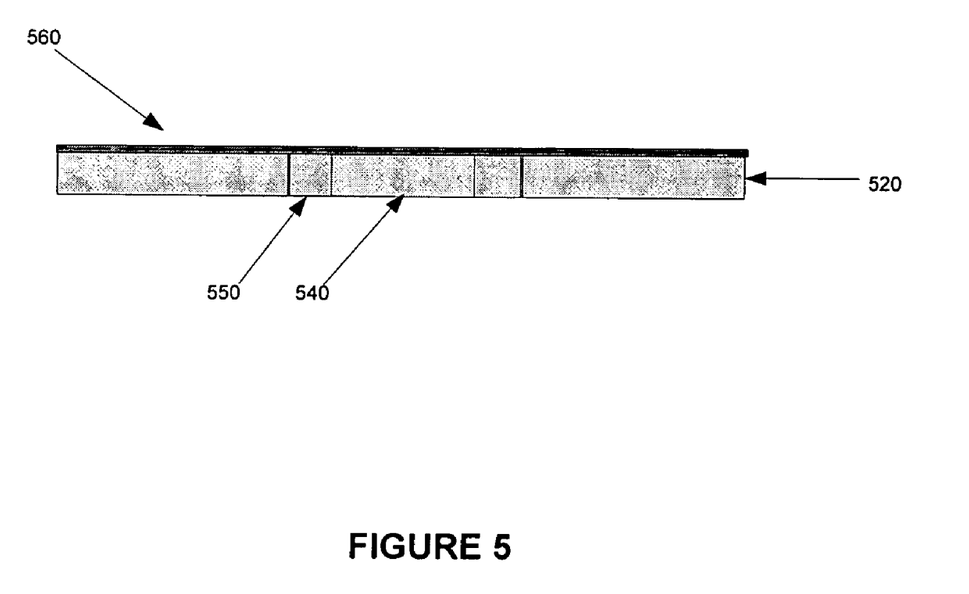
FIG. 5 is an example diagram of a processed multi-chip module.
Figure 6:
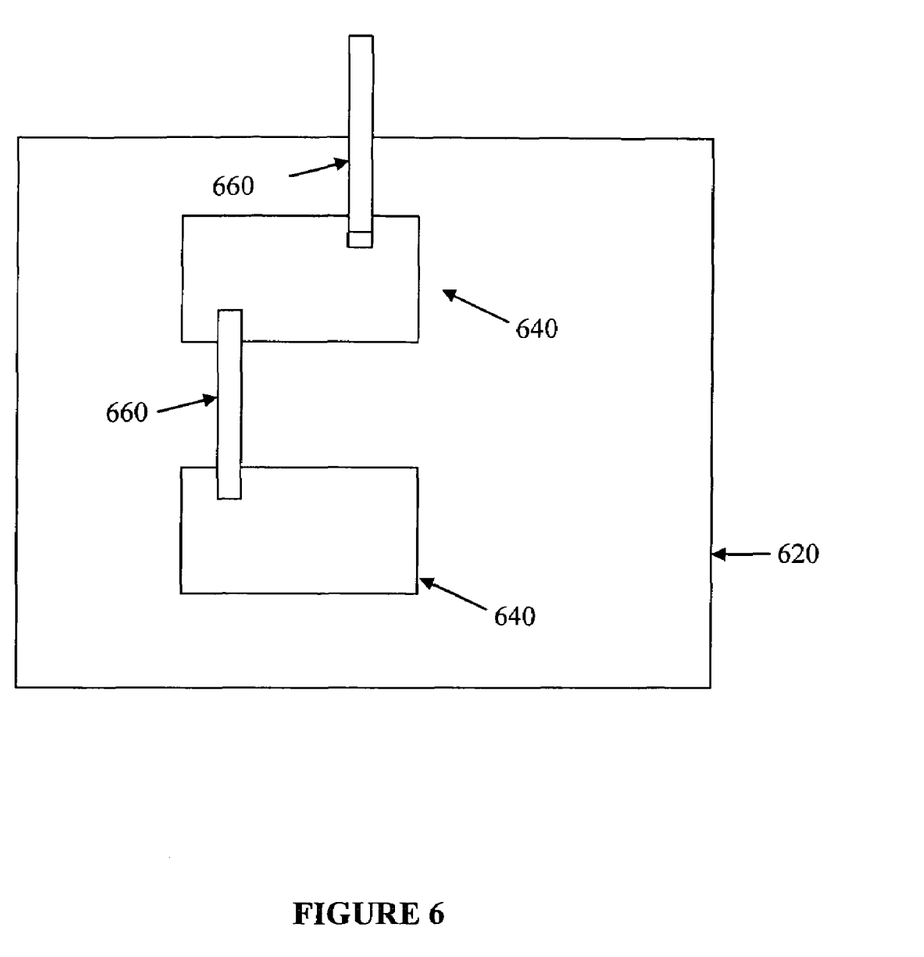
FIG. 6 is a top-down view of the multi-chip module.

As depicted in FIG. 5, after the polymer deposition and polymerization, at block 150, at room temperature for a period (typically 24 hours), the substrate 520, along with the integrated chips 540, is peeled off from the flat surface, at block 160. The integrated substrate 520 and IC chips 540 are now an integrated network, known as a multi-chip module (MCM). A thin layer of high dielectric material, such as a negative, epoxy-type, near-UV photoresist, polyimide, low-k benzocyclobutene (BCB), low-temperature deposited silicon dixide (SiO2), silicon nitride (Si3N4), or aluminum oxide (Al2O3), or LCP 560 may be deposited, at block 170, on the top surface of the multi-chip module to improve the flatness of the top surface. Finally, as shown in FIG. 6, interconnect metals 660 may be patterned and created, at block 180, from and between the integrated chips 640 placed into the substrate 620. The metal interconnect lines 660 may be copper (Cu), gold (Au), or aluminum (Al) alloys typically used in conventional semiconductor processing.

The application also presents an MCM 700 (see FIG. 7) that is created by the polymer-based heterogeneous integration process 100 presented above. The MCM 700 includes a plurality of semiconductor IC chips 740, mounted into the patterned positions of the substrate 720. The semiconductor chips 740 may be connected to the substrate by a polymer-based integrating material 750, such as a polydimethylsiloxane (PDMS), ultraviolet (UV) cure epoxy resin or adhesive, an electronic grade encapsulant, a die attach adhesive, an epoxy, deposited amorphous Si, or deposited or electroplated Au, Cu, or Al or combination thereof, which fills the trench regions 750 between the lateral sides of the IC chips 740 and the lateral walls of the patterned recesses created in the substrate 720. The IC chips 740 in the multi-chip module may be connected to each other and to regions (not illustrated) off the substrate 720 by metal interconnect lines 760.

Figure 7:
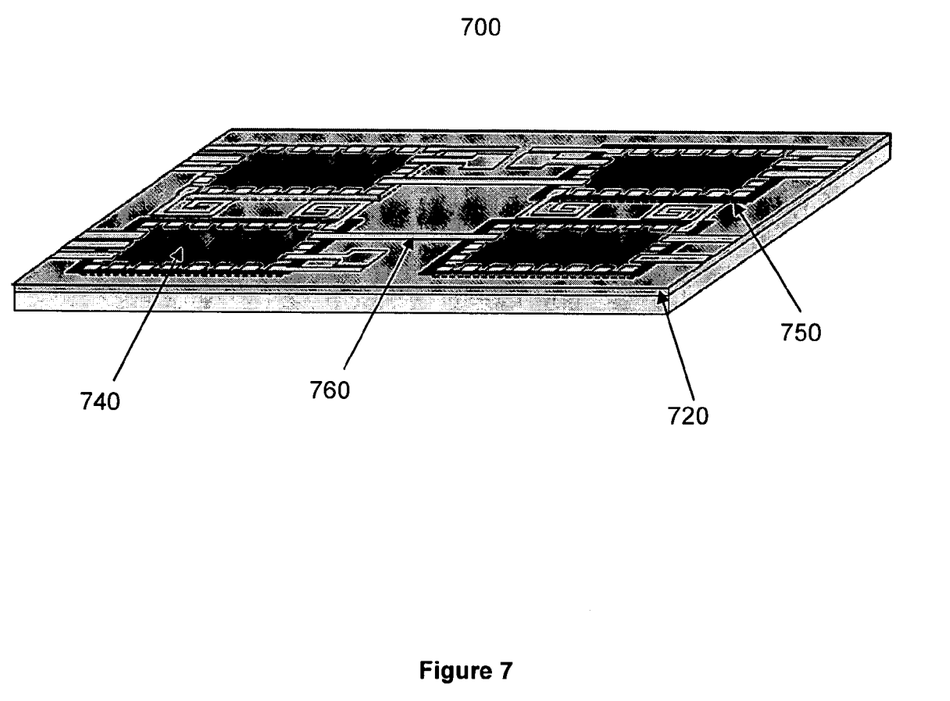
FIG. 7 is a perspective view of the multi-chip module.

The substrate 720 may be, but is not limited to, silicon (Si), quartz, gallium arsenide (GaAs), liquid crystal polymer (LCP) or other polymer substrate or LTCC. The metal interconnect lines 760 may be copper (Cu), gold (Au), or aluminum (Al) alloys typically used in conventional semiconductor processing.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method for semiconductor chip-to-package integration comprising steps in an order of:

removing a portion of a substrate to create a plurality of patterned and recessed positions for a plurality of semiconductor chips to be placed within the patterned and recessed positions, where the widths of the patterned and recessed positions are slightly larger than the widths of the semiconductor chips;

flipping the substrate onto a flat surface;

securing the substrate to the flat surface;

placing the semiconductor chips in the patterned and recessed positions such that trench-like regions are created between the lateral sides of the semiconductor chips and the lateral walls of the patterned and recessed positions;

filling the trench-like regions with a polymer-based substance;

polymerizing the polymer-based substance such that the substrate and the semiconductor chips are integrated to form a multi-chip module;

removing the multi-chip module from the flat surface; and depositing a thin layer of a low dielectric constant material on a top surface of the multi-chip module.

2. A method as in claim 1 further comprising patterning and creating a plurality of metal interconnect lines connecting one or more of the plurality of semiconductor chips in the multi-chip module to one or more other semiconductor chips within the multi-chip module.

3. A method as in claim 1 further comprising patterning and creating a plurality of metal interconnect lines connecting one or more of the plurality of semiconductor chips in the multi-chip module to regions off the multi-chip module.

4. A method as in claim 1 where filling the trench-like regions comprises filling with a polydimethylsiloxane (PDMS), ultraviolet (UV) cure epoxy resin or adhesive, an electronic grade encapsulant, a die attach adhesive, an epoxy, deposited amorphous Si, or deposited or electroplated Au, Cu, or Al or combination thereof.

5. A method as in claim 1 where flipping the substrate onto a flat surface comprises flipping the substrate onto a flat surface comprising a polydimethylsiloxane (PDMS), ultraviolet (UV) cure epoxy resin or adhesive, an electronic grade encapsulant, a die attach adhesive, an epoxy, deposited amorphous Si, or deposited or electroplated Au, Cu, or Al or combination thereof.

6. A method as in claim 1 where removing the substrate comprises etching a substrate comprising silicon, quartz, gallium arsenide, liquid crystal polymer (LCP) or a ceramic substrate.

7. A method as in claim 6 where etching the substrate comprises etching using a deep reactive ion etching process, laser ablation or substrate punching.

8. A method according to claim 1 where securing the substrate comprises securing the substrate with a bonding agent.

9. A method as in claim 8 where securing the substrate with a bonding agent comprises securing the substrate with a soap film.

10. A method as in claim 9 where securing the substrate with a soap film comprises securing the substrate with a soap film composed of a proportion of diluted water and a proportion of dish soap.

11. A method as in claim 10 where securing the substrate with a soap film composed of a proportion of diluted water and a proportion of dish soap comprises securing the substrate with a soap film where the proportion of diluted water is 90% and the proportion of dish soap is 10%.

12. A method as in claim 1 where depositing a thin layer of a low-dielectric constant material comprises depositing a negative, epoxy-type, near-UV photoresist, polyimide, low-k benzocyclobutene (BCB), low-temperature deposited silicon dixide ($SiO_2$), silicon nitride ($Si_3N_4$), or aluminum oxide ($Al_2O_3$), or LCP.

13. A method as in claim 1 where polymerizing comprises polymerizing for a period of time greater than 24 hours.

14. The method as in claim 1 where patterning and creating a plurality of metal interconnect lines comprises patterning and creating metal interconnect lines composed of at least one of a metal or a metal alloy selected from the group comprising: Au, Cu, and Al.

15. A method for semiconductor chip-to-package integration comprising:
removing a portion of a substrate to create a plurality of patterned and recessed positions for a plurality of semiconductor chips to be placed within the patterned and recessed positions, where the widths of the patterned and recessed positions are slightly larger than the widths of the semiconductor chips;
flipping the substrate with the plurality of patterned and recessed positions onto a flat surface;
securing the substrate with the plurality of patterned and recessed positions to the flat surface;
placing the semiconductor chips in the patterned and recessed positions such that trench-like regions are created between the lateral sides of the semiconductor chips and the lateral walls of the patterned and recessed positions;
filling the trench-like regions with a polymer-based substance;
polymerizing the polymer-based substance such that the substrate and the semiconductor chips are integrated to form a multi-chip module;
removing the multi-chip module from the flat surface; and
after the removing the multi-chip module, depositing a thin layer of a low dielectric constant material on a top surface of the multi-chip module.

* * * * *

UNITED STATES PATENT AND TRADEMARK OFFICE
CERTIFICATE OF CORRECTION

| | | |
|---|---|---|
| PATENT NO. | : 7,473,579 B2 | Page 1 of 1 |
| APPLICATION NO. | : 11/343256 | |
| DATED | : January 6, 2009 | |
| INVENTOR(S) | : Hasan Sharifi et al. | |

It is certified that error appears in the above-identified patent and that said Letters Patent is hereby corrected as shown below:

In the Claims

In column 5, claim 12, line 27, before "constant material comprises" replace "low-dielectric" with --low dielectric--.

Signed and Sealed this
Fourth Day of January, 2011

David J. Kappos
*Director of the United States Patent and Trademark Office*